(12) United States Patent
Zang et al.

(10) Patent No.: US 10,170,353 B2
(45) Date of Patent: Jan. 1, 2019

(54) DEVICES AND METHODS FOR DYNAMICALLY TUNABLE BIASING TO BACKPLATES AND WELLS

(71) Applicant: GLOBALFOUNDRIES Inc., Grand Cayman (KY)

(72) Inventors: Hui Zang, Guilderland, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/634,091

(22) Filed: Jun. 27, 2017

(65) Prior Publication Data

US 2017/0294336 A1    Oct. 12, 2017

Related U.S. Application Data

(62) Division of application No. 15/075,890, filed on Mar. 21, 2016, now Pat. No. 9,716,138.

(51) Int. Cl.
*H01L 21/74* (2006.01)
*H01L 23/48* (2006.01)
*H01L 29/06* (2006.01)
*H01L 29/10* (2006.01)
*H01L 21/762* (2006.01)
*H01L 21/768* (2006.01)

(52) U.S. Cl.
CPC ........ *H01L 21/743* (2013.01); *H01L 21/7624* (2013.01); *H01L 21/76229* (2013.01); *H01L 21/76283* (2013.01); *H01L 21/76831* (2013.01); *H01L 21/76877* (2013.01); *H01L 23/481* (2013.01); *H01L 29/0649* (2013.01); *H01L 29/1087* (2013.01)

(58) Field of Classification Search
None
See application file for complete search history.

(56) References Cited

U.S. PATENT DOCUMENTS 7,399,664 B1    7/2008  Anderson
8,288,231 B1   10/2012  Liao
2006/0284251 A1 12/2006 Hsu
(Continued)

OTHER PUBLICATIONS

Kim et al., "S-RCAT (Sphere-shaped-Recess-Channel-Array Transistor) Technology for 70nm DRAM feature size and beyond," Jul. 25, 2005, pp. 34-35, 2005 Symposium on VLSI Technology Digest of Technical Papers.

(Continued)

*Primary Examiner* — Erik Kielin
(74) *Attorney, Agent, or Firm* — Heslin Rothenberg Farley & Mesiti P.C.

(57) ABSTRACT

Devices and methods of fabricating integrated circuit devices for dynamically applying bias to back plates and/or p-well regions are provided. One method includes, for instance: obtaining a wafer with a silicon substrate, at least one first oxide layer, at least one silicon layer, and at least one second oxide layer; forming at least one recess in the wafer; depositing at least one third oxide layer over the wafer and filling the at least one recess; depositing a silicon nitride layer over the wafer; and forming at least one opening having sidewalls and a bottom surface within the filled at least one recess. An intermediate semiconductor device is also disclosed.

11 Claims, 13 Drawing Sheets

(56) References Cited

U.S. PATENT DOCUMENTS

2011/0281415 A1    11/2011  Kang
2012/0261792 A1    10/2012  Cheng
2015/0061006 A1*  3/2015  Shinohara ........... H01L 29/7824
                                                                                     257/336

OTHER PUBLICATIONS

Grenouillet et al., "UTBB FDSOI transistors with dual STI for a multi-Vt strategy at 20nm node and below," Mar. 14, 2013, pp. 64-67, IEDM, 2012 IEEE International.

* cited by examiner

DEVICES AND METHODS FOR DYNAMICALLY TUNABLE BIASING TO BACKPLATES AND WELLS

CROSS-REFERENCE TO RELATED APPLICATION

This application is a divisional of U.S. application Ser. No. 15/075,890 filed Mar. 21, 2016, which is hereby incorporated herein by reference in its entirety.

FIELD OF THE INVENTION

The present invention relates to semiconductor devices and methods of fabricating semiconductor devices, and more particularly, to devices and methods of forming transistors for dynamically applying bias to back-plates and wells.

BACKGROUND OF THE INVENTION

The current ultra-thin-body-BOX (UTBB) substrate on insulator technology allows for multi-$V_t$ scheme by applying bias on the back plate. This technique can be implemented by using a single shallow trench isolation (STI) depth scheme or a double STI depth scheme. The current techniques, however, involve complicated scheme of back plates and various bias, with each back plate requiring a contact on the bulk substrate region. Such requirements severely limit the design flexibility and scaling for advanced technology.

Therefore, it may be desirable to develop transistor structures that allow for reduced bulk substrate contacts and for dynamic biasing of back-plates or p-wells.

BRIEF SUMMARY

The shortcomings of the prior art are overcome and additional advantages are provided through the provision, in one aspect, a method that includes, for instance: obtaining a wafer having a silicon substrate, at least one first oxide layer, at least one silicon layer, and at least one second oxide layer; forming at least one recess in the wafer; depositing at least one third oxide layer over the wafer and filling the at least one recess; depositing a silicon nitride layer over the wafer; and forming at least one opening having sidewalls and a bottom surface within the filled at least one recess.

In another aspect, a method is provided that includes, for instance: obtaining a wafer having a silicon substrate, at least one first oxide layer, at least one silicon layer, and at least one second oxide layer; forming at least one first recess in the wafer; depositing oxide over the wafer and filling the at least one first recess; depositing a silicon nitride layer over the wafer; and forming at least one second recess in the wafer.

In another aspect, a device is provided which includes, for instance: a wafer having a silicon substrate, at least one first oxide layer disposed on at least a portion of the wafer, at least one silicon layer disposed on the at least one first oxide layer, at least one second oxide layer disposed on the at least one silicon layer; and at least one recess in the wafer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, including transistor devices for ultra-thin-body-BOX fully depleted silicon on insulator (UTBB-FDSOI) technology, which provide advantages over the above noted, existing semiconductor devices and fabrication processes. Advantageously, the integrated circuit device fabrication processes disclosed herein provide for semiconductor devices with reduced number of bulk substrate contacts, and that allow for dynamically applying bias to back plates and/or p-well for optimized operations.

Figure 1:
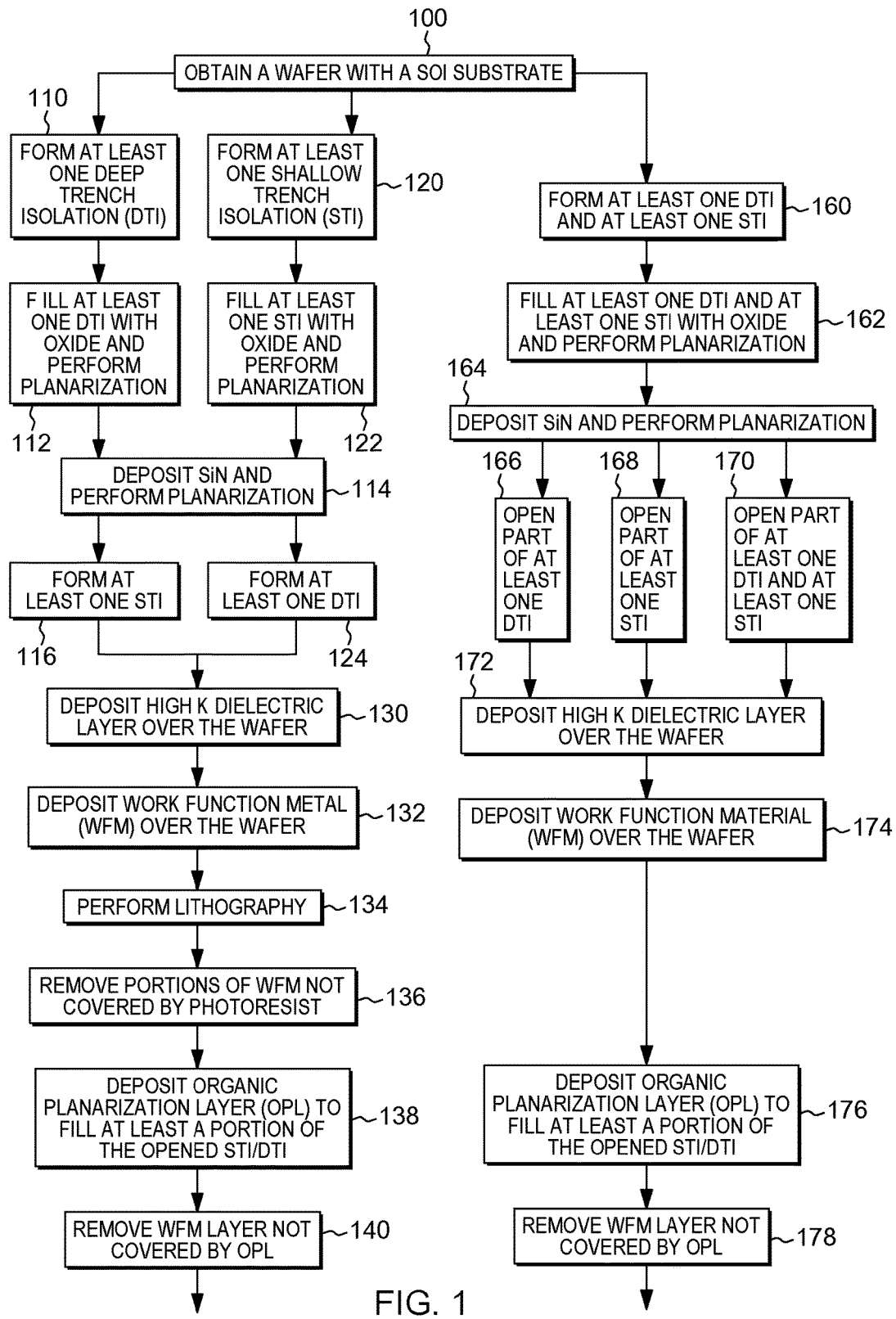
FIG. 1 depicts several embodiments of methods for forming an intermediate semiconductor structure, in accordance with one or more aspects of the present invention.
Figure 1:
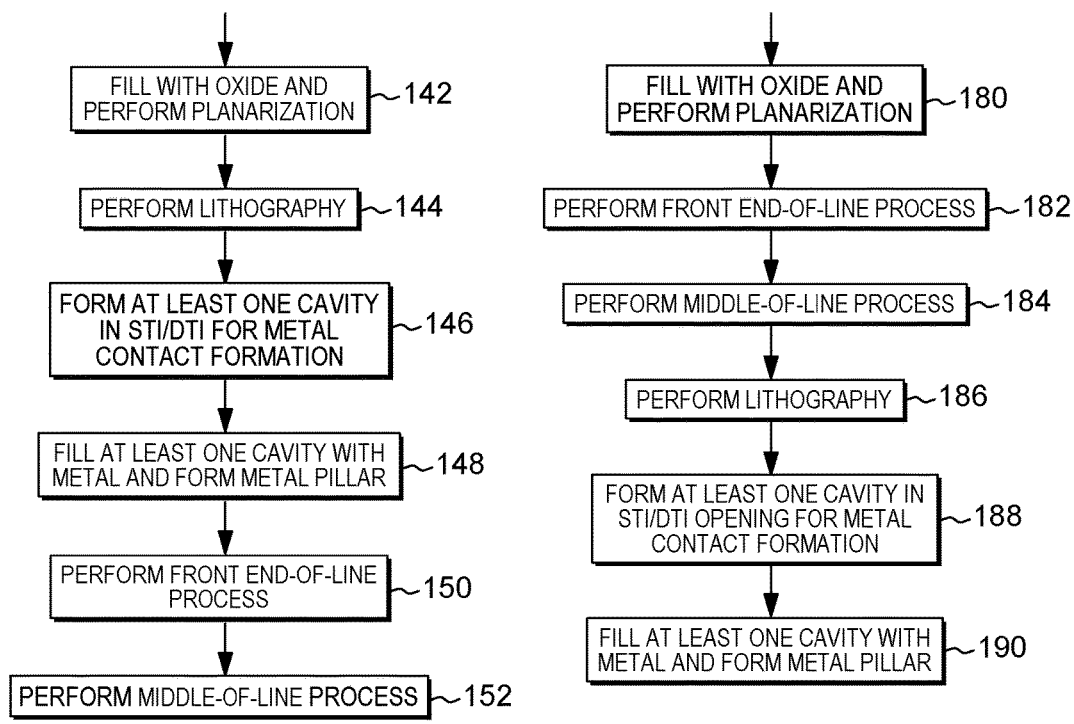

In one aspect, in one embodiment, as shown in FIG. 1, an integrated circuit device formation process in accordance with one or more aspects of the present invention may include, for instance: obtaining a wafer with a silicon on insulator (SOI) substrate 100; forming at least one deep trench isolation (DTI) recess and at least one shallow trench isolation (STI) recess 160; filling the at least one DTI recess and at least one STI recess with oxide and performing planarization 162; depositing a layer of silicon nitride (SiN) over the wafer and performing planarization 164; opening a part of the at least one DTI recess 166, or opening at least a part of the at least one STI recess 168, or opening a part of the at least one DTI recess and the at least one STI recess 170; depositing a high k dielectric layer over the wafer 172; depositing a work function material (WFM) layer over the wafer 174; depositing an organic planarization layer (OPL) within the opened at least one STI recess and/or DTI recess for partial filling 176; removing a portion of the WFM layer not covered by the OPL 178; depositing a layer of oxide to fill the opened at least one STI recess and/or DTI recess and performing planarization 180; performing front end of the line process 182; performing middle end of the line process 184; performing lithography 186; forming at least one cavity in the at least one STI recess and/or DTI recess for metal contact formation 188; and filling the at least one cavity with metal and forming metal pillars 190.

In another aspect, in another embodiment, as shown in FIG. 1, an integrated circuit device formation process in accordance with one or more aspects of the present invention may include, for instance: obtaining a wafer with a silicon on insulator (SOI) substrate 100; forming at least one deep trench isolation (DTI) recess 110 or at least one shallow trench isolation (STI) recess 120; filling the at least one DTI recess with oxide and performing planarization 112 or filling the at least one STI recess with oxide and performing planarization 122; depositing a layer of silicon nitride (SiN) over the wafer and performing planarization 114; forming at least one STI recess where at least one DTI recess has been formed and filled with oxide 116, or forming at least one DTI recess where at least one STI recess has been formed and filled with oxide 124; depositing a high k dielectric layer over the wafer 130; depositing a work function material (WFM) layer over the wafer 132; performing lithography to pattern and etch the at least one STI recess and/or DTI recess 134; removing portions of WFM not covered by photoresist 136; depositing an organic planarization layer (OPL) within the opened at least one STI recess and/or DTI recess for partial filling 138; etching to remove a portion of the WFM layer not covered by the OPL 140; depositing a layer of oxide to fill the opened at least one STI recess and/or DTI recess and performing planarization 142; performing lithography to form at least one cavity in the at least one STI recess and/or DTI recess for metal contact formation 146; filling the at least one cavity with metal and forming metal pillars 148; performing front end of the line process 150; and performing middle end of the line process 152.

FIGS. 2-11 depict, by way of example only, one detailed embodiment of a portion of the semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 2:
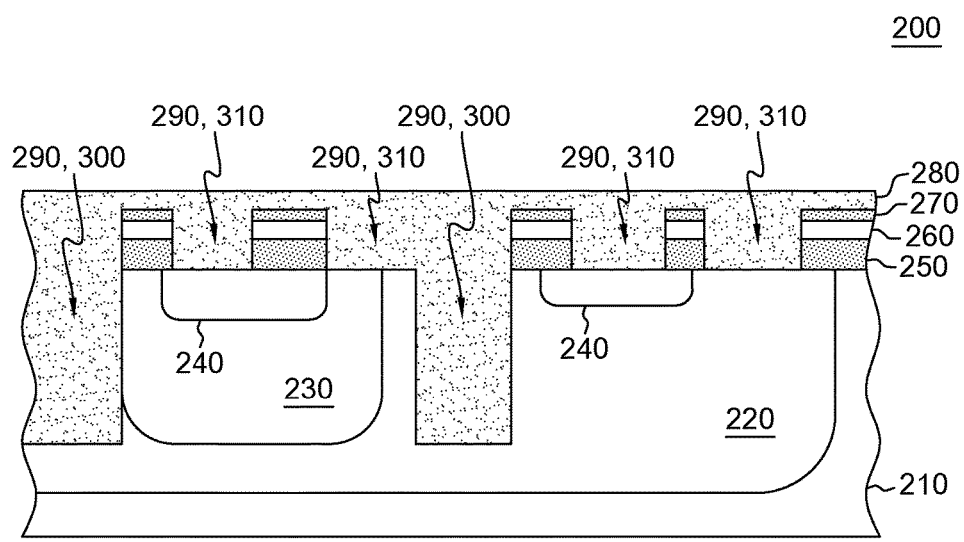
FIG. 2 depicts a cross-sectional elevation view of one embodiment of an intermediate semiconductor device, in accordance with one or more aspects of the present invention.

FIG. 2 shows a portion of an intermediate semiconductor device 200 obtained during the fabrication process. The device 200 may have been processed through initial device processing steps in accordance with the design of the device 200 being fabricated, for example, the device 200 may include, for instance, a substrate 210, for example, a silicon substrate, with at least one n-well region 220, at least one p-well region 230, and at least one back-plate implant 240. The at least one n-well region 220 may be, for instance, a deep n-well region. The device 200 may also include source regions (not shown), drain regions (not shown), sacrificial gate structures (not shown) and the like.

As depicted in FIG. 2, the device 200 may have at least one first layer of oxide 250 formed over the device 200 to form a layer on the substrate 210. At least one silicon layer 260 may be formed on the least one first layer of oxide 250. For example, a silicon on insulator (SOI) substrate may be used. At least one second oxide layer 270 may be deposited on the least one silicon layer 260. The deposition process may be any conventional methods and techniques, for example, atomic layer deposition (ALD), chemical vapor deposition (CVD), or physical layer deposition (PVD).

Lithography may have been performed to form at least one recess 290 within the device 200, as depicted in FIG. 2. The lithography may be performed by known methods including depositing a lithography stack (not shown) over the device 200, patterning the lithography stack (not shown) and then etching into, for example, at least one deep trench isolation (DTI) recess 300 that extends through the least one second oxide layer 270, the least one silicon layer 260, the least one first oxide layer 250, and into the substrate 210, and removing the photoresist (not shown). The at least one recess 290 may also be at least one shallow trench isolation (STI) recess 310 that extends through the least one second oxide layer 270, the least one silicon layer 260, and the least one first oxide layer 250, as also depicted in FIG. 2. As further depicted in FIG. 2, at least one third oxide layer 280 may be deposited over the device 200, forming a layer on the at least one second oxide layer 270 and filling the at least one recess 290, for example, the at least one DTI recess 300 and the at least one STI recess 310, and planarized. The planarization process may be any conventional methods and techniques, for example, chemical mechanical planarization (CMP).

Figure 3:
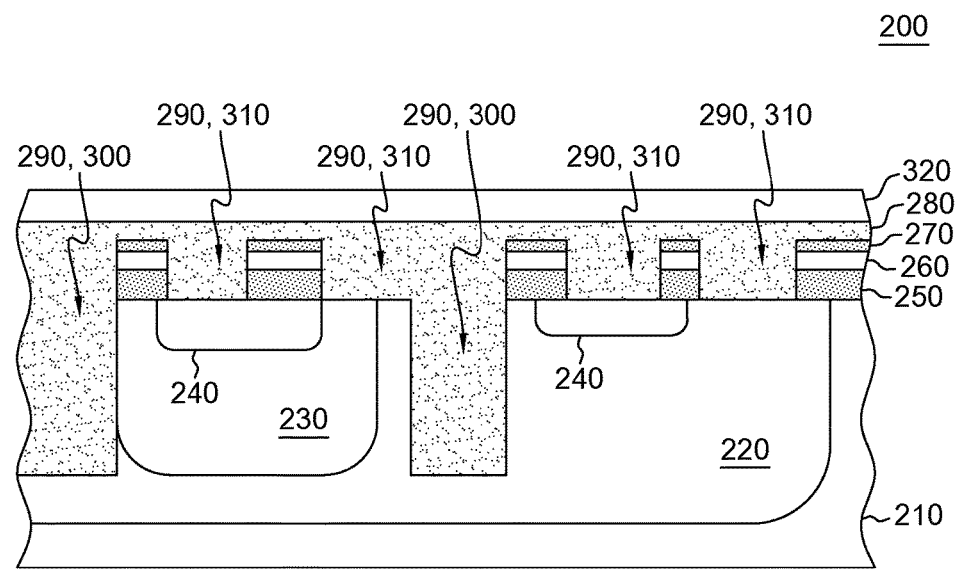
FIG. 3 depicts a cross-sectional elevation view of the structure of FIG. 2 after depositing a silicon nitride layer over the device, in accordance with one or more aspects of the present invention.

As depicted in FIG. 3, a silicon nitride (SiN) layer 320 may be deposited over the device 200 and disposed on the at least one third oxide layer 280. After the deposition, the SiN layer 320 may be planarized by, for example, CMP.

Figure 4:
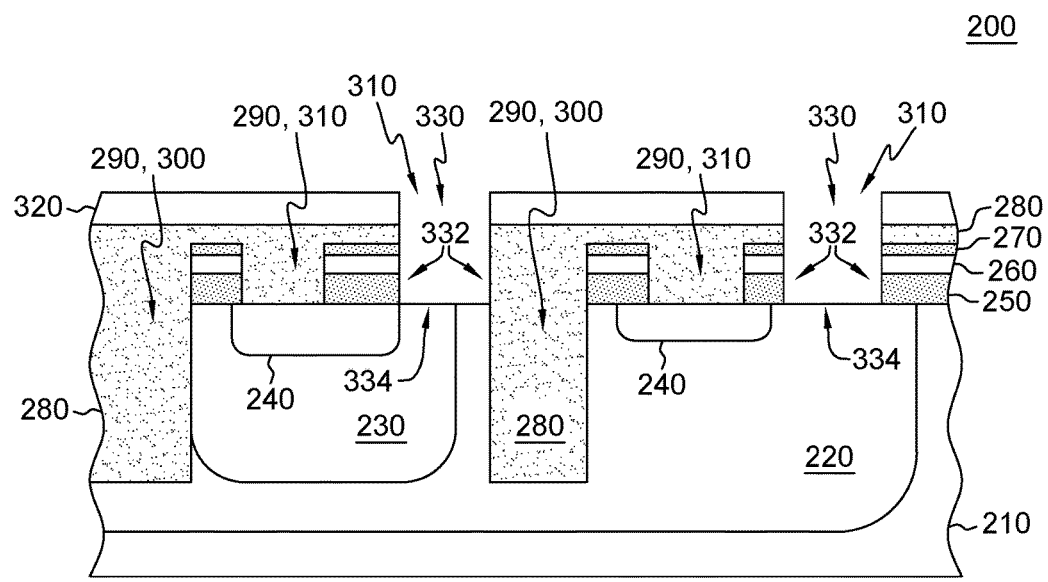
FIG. 4 depicts a cross-sectional elevation view of the structure of FIG. 3 after forming at least one opening having sidewalls and a bottom surface, within at least one recess, in accordance with one or more aspects of the present invention.

As depicted in FIG. 4, lithography may be performed to form at least one opening 330 within the at least one recess 290. For example, at least one opening 330 may be formed within the at least one STI recess 310. The at least one opening 330 may extend through the SiN layer 320, the at least one third oxide layer 280, the at least one second oxide layer 270, the at least one silicon layer 260, and the at least one first oxide layer 250, and to the top of the substrate 210. The at least one opening 330 may be formed, the at least one opening 330 having sidewalls 332 and a bottom surface 334, which is the top of substrate 210.

Figure 5:
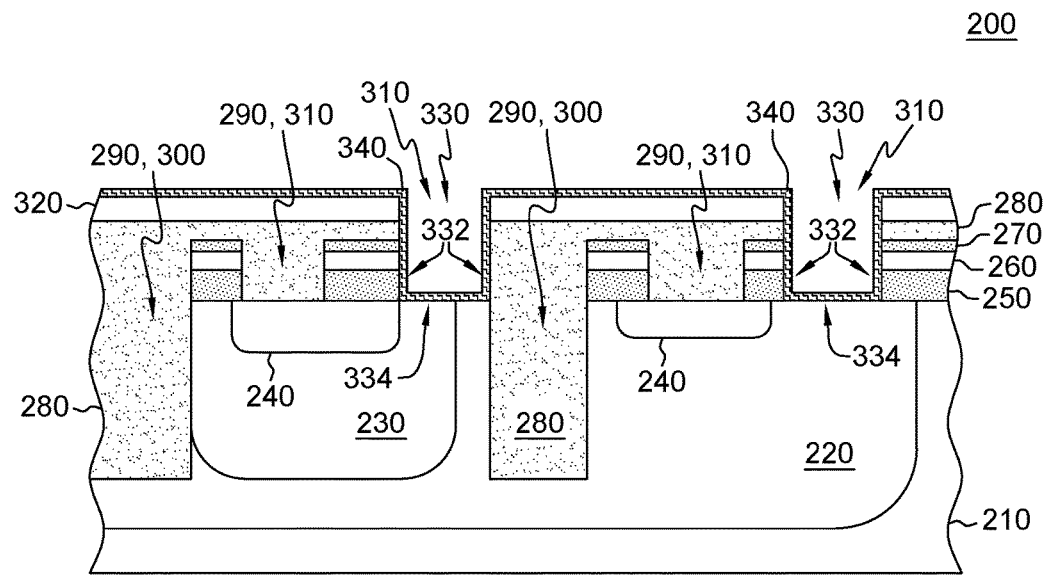
FIG. 5 depicts a cross-sectional elevation view of the structure of FIG. 4 after depositing a high k dielectric layer over the device, in accordance with one or more aspects of the present invention.

As depicted in FIG. 5, a high k dielectric layer 340 may be deposited over the device 200. For example, the high k dielectric layer 340 may be disposed on the SiN layer 320 and on the sidewalls 332 and the bottom surface 334 of the at least one opening 330. The high k dielectric layer 340 may include dielectric material, for instance, hafnium oxide ($HfO_2$), aluminum oxide ($Al_2O_3$), hafnium aluminum oxide (HfAlO), nitrogen doped hafnium oxide (HfNO), or any combination of them. The high k dielectric layer 340 may be a thin layer, for instance, 1 nm to 10 nm in thickness. For example, a high k dielectric layer 340 of 2 nm to 3 nm thickness may be used in the fabrication of a FEOL device.

Figure 6:
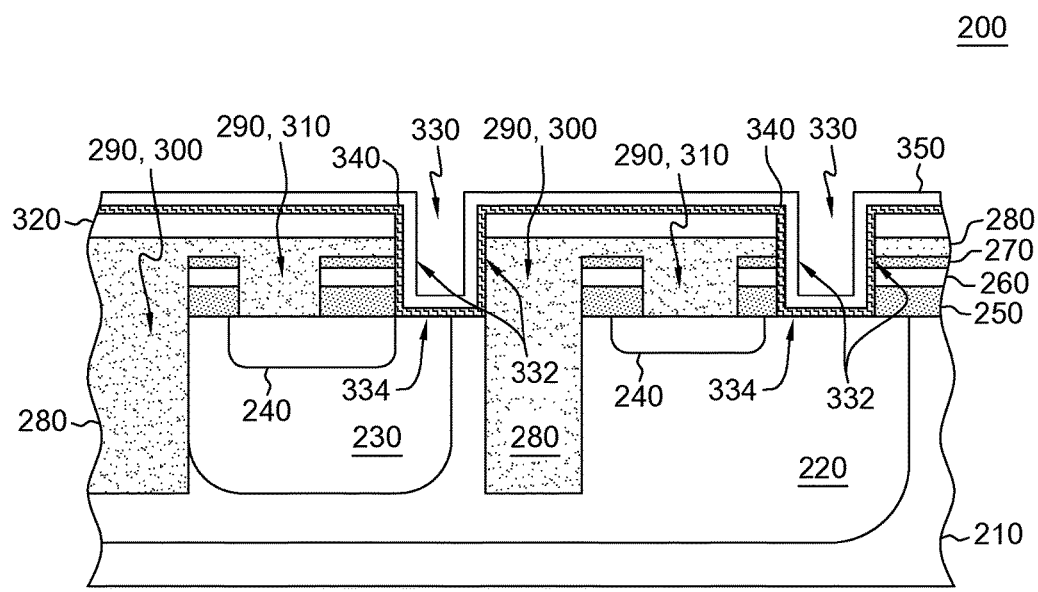
FIG. 6 depicts a cross-sectional elevation view of the cross-sectional elevation view of the structure of FIG. 5 after depositing a work function metal (WFM) layer over the device, in accordance with one or more aspects of the present invention.

As depicted in FIG. 6, a layer of work function material (WFM) 350 may be deposited over the device 200. For example, the WFM 350 may be disposed on the high k dielectric layer 340. The WFM layer 350 may be a thin layer, for instance, 1 nm to 10 nm in thickness. For example, a WFM layer 350 of 4 nm to 6 nm thickness may be used in the fabrication of a FEOL device. The WFM layer 350 may include, for example, titanium nitride (TiN), titanium carbon aluminum (TiCAl), tantalum nitride (TaN), aluminum (Al), or any combination of them.

Figure 7:
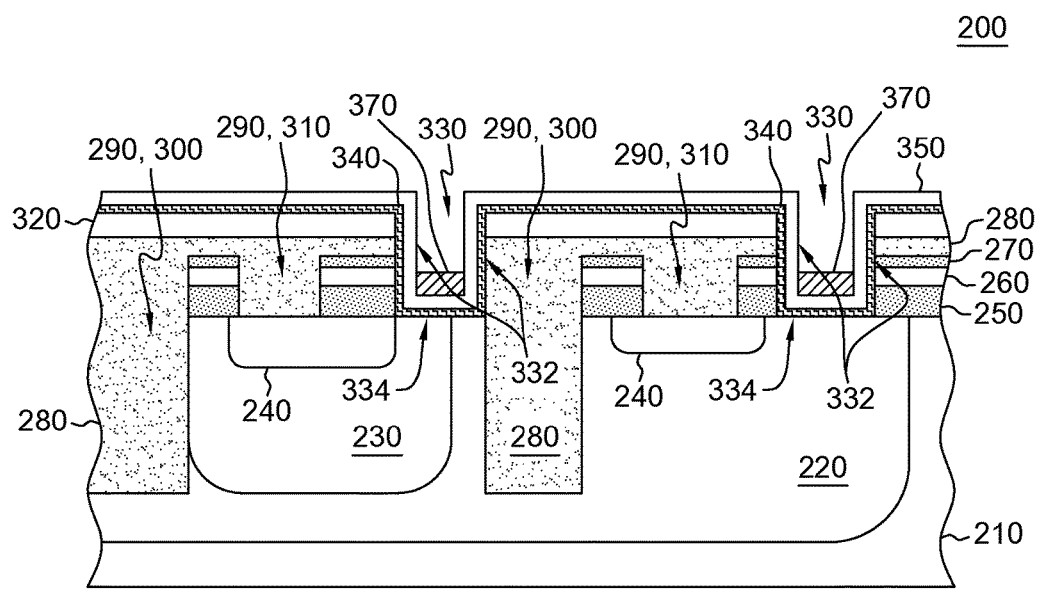
FIG. 7 depicts a cross-sectional elevation view of the structure of FIG. 6 after depositing an organic planarization layer (OPL) to partially fill the at least one opening and covering a portion of the WFM layer, in accordance with one or more aspects of the present invention.

As depicted in FIG. 7, an organic planarization layer (OPL) 370 may be deposited to partially fill the at least one opening 330. For example, the OPL 370 may be deposited to fill the at least one opening 330 to a level such that the top of the OPL 370 is between the at least one first oxide layer 250 and the at least one second oxide layer 270.

Figure 8:
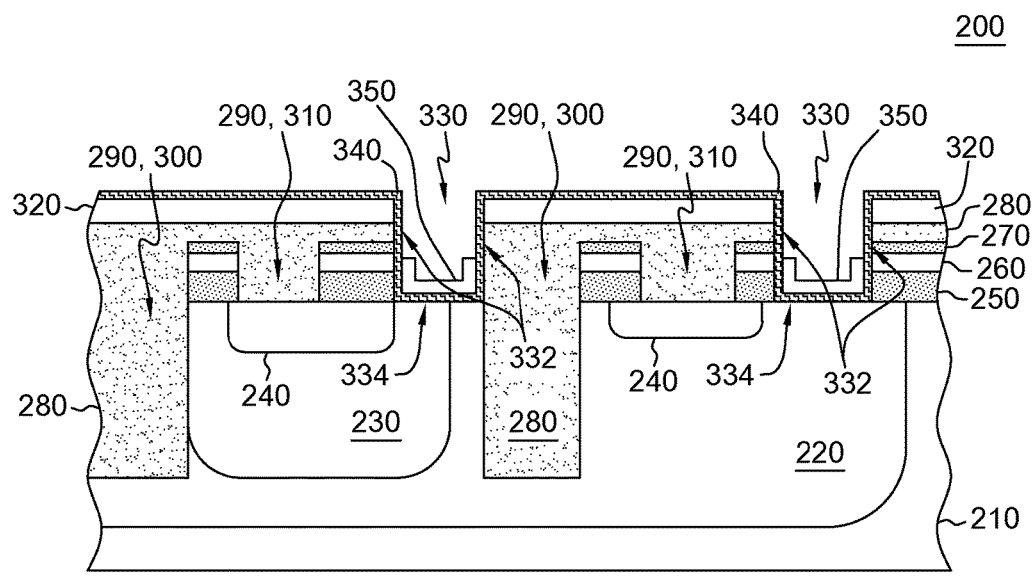
FIG. 8 depicts a cross-sectional elevation view of the structure of FIG. 7 after performing OPL chamfer and etching to remove at least a portion of the WFM layer, in accordance with one or more aspects of the present invention.

As depicted in FIG. 8, at least a portion of the WFM layer 350 and the OPL 370 may be removed. For instance, the device 200 may be patterned for metal chamfering and metal chamfer may be performed to remove at least a portion of the WFM layer 350, e.g. the portion not covered by the OPL 370 (not shown). Lithography may be performed to pattern and etch to remove the OPL 370 (not shown). As depicted in FIG. 8, a portion of the WFM layer 350 may remain on a portion of the sidewalls 332 and on the bottom surface 334 of the at least one opening 330. For example, the height of the WFM layer 350 remaining on the sidewalls 332 may be at a level between the first oxide layer 250 and the second oxide layer 270 of the device 200, as depicted in FIG. 8.

Figure 9:
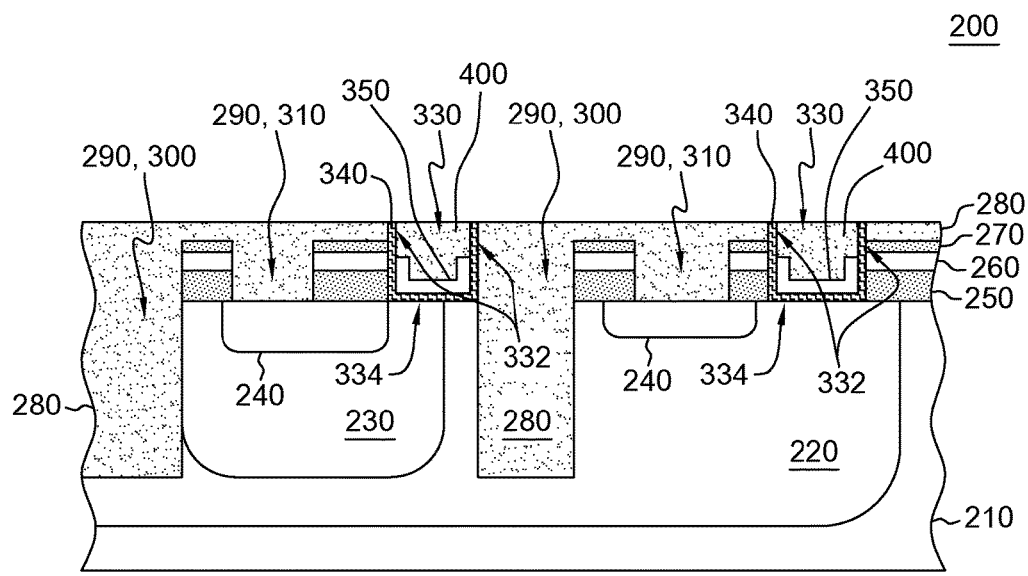
FIG. 9 depicts a cross-sectional elevation view of the structure of FIG. 8 after depositing an oxide layer over the device, filling the at least one opening, and planarizing the device, in accordance with one or more aspects of the present invention.

An oxide layer 400 may be deposited over the device 200 to fill the at least one opening 330. After deposition, the oxide layer 400 may be planarized, for example, by CMP, as depicted in FIG. 9. The CMP may also remove, for example, the SiN layer 320 and portions of the high k dielectric layer 340.

Figure 10:
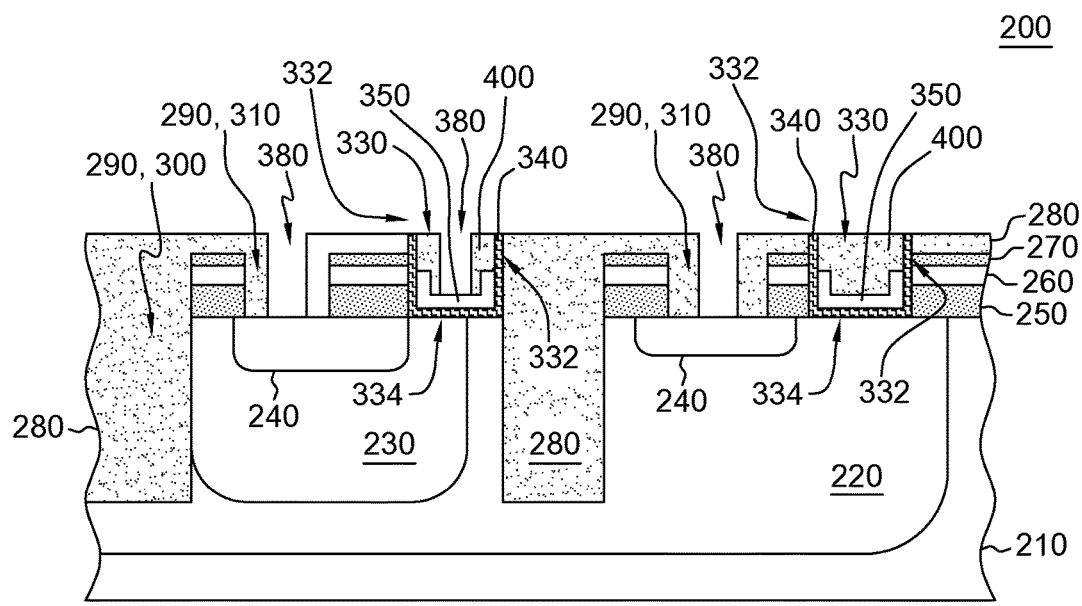
FIG. 10 depicts a cross-sectional elevation view of the structure of FIG. 9 after forming at least one cavity within the at least one recess, in accordance with one or more aspects of the present invention.

The device 200 may undergo front end of the line (FEOL) processes and back end of the line (BEOL) processes. Lithography may be performed to pattern and etch, for instance, at least one cavity 380 within the at least one opening 330, as depicted in FIG. 10. The at least one cavity 380 may be formed within, for instance, at least one STI recess 310 that is filled with the at least one third oxide layer 280 such that the at least one cavity 380 extends through the SiN layer 320 and the at least one third oxide layer 280, to the top of the substrate 210. The at least one cavity 380 may also be formed within, for instance, at least one STI recess 310 that has the high k dielectric layer 340 and the WFM layer 350 disposed on the sidewalls 332 and the bottom surface 334, such that the at least one cavity 380 extends through the oxide 400 to the top of the WFM layer 350.

Figure 11:
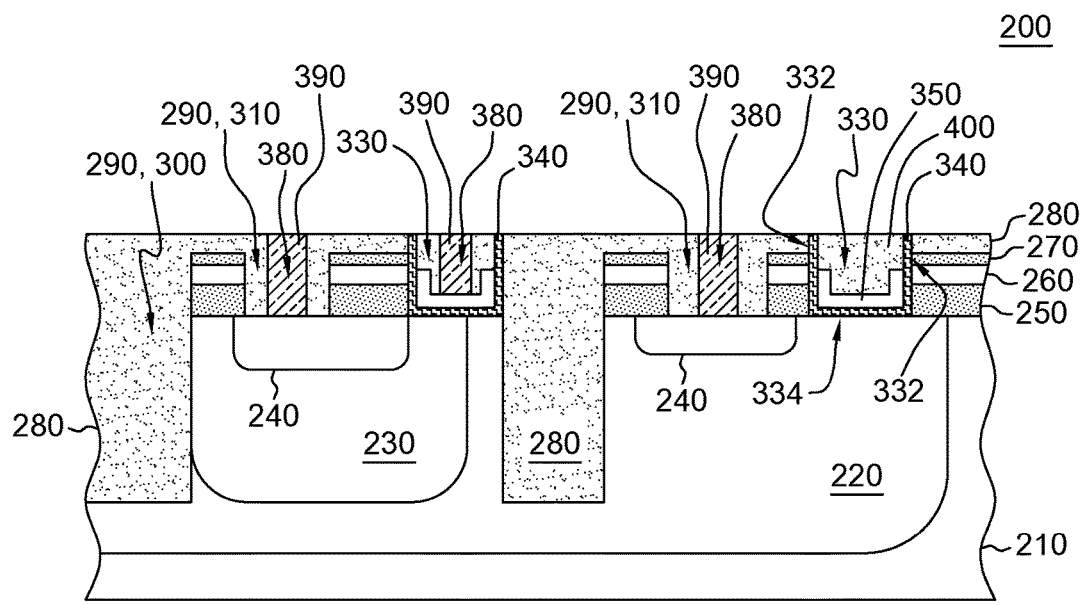
FIG. 11 depicts a cross-sectional elevation view of the structure of FIG. 10 after filling the at least one cavity with metal, in accordance with one or more aspects of the present invention.

Metallization processes may be performed on the device 200 and as depicted in FIG. 11, the at least one cavity 380 may be filled with metal 390, for example, tungsten (W).

FIGS. 12-20 depict, by way of example only, another detailed embodiment of a portion of the semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 12:
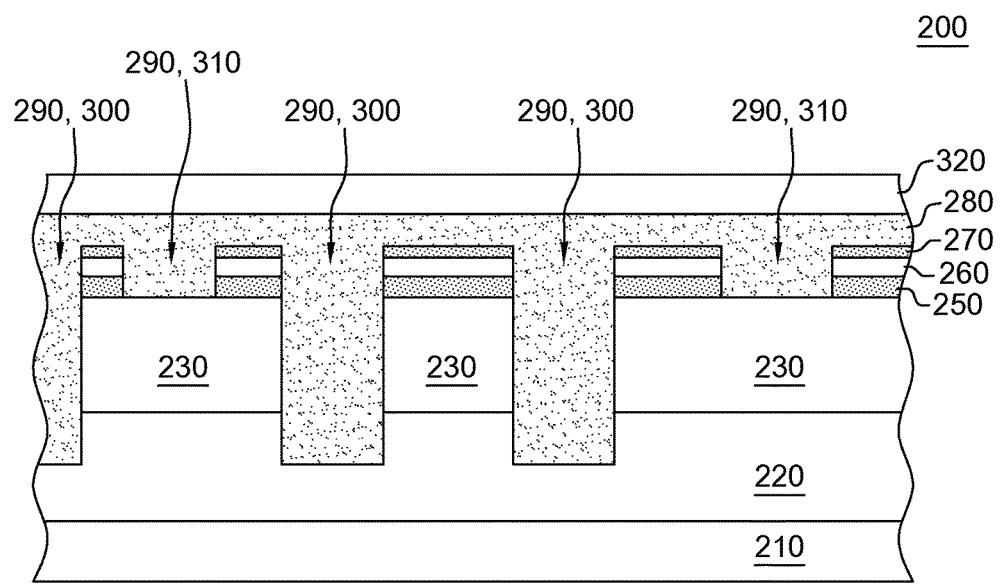
FIG. 12 depicts a cross-sectional elevation view of another embodiment of an intermediate semiconductor device, in accordance with one or more aspects of the present invention.

FIG. 12 shows a portion of an intermediate semiconductor device 200 obtained during the fabrication process. As described above, the device 200 may have been processed through initial device processing steps in accordance with the design of the device 200 being fabricated. As described above, the device 200 may have at least one first layer of oxide 250 formed over the device 200 to form a layer on the substrate 210. The substrate 210 may be, for example, a silicon substrate. At least one silicon layer 260 may be formed on the at least one first layer of oxide 250. For example, a silicon on insulator (SOI) substrate may be used. At least one second layer of oxide 270 may be deposited on the at least one silicon layer 260. The deposition process may be any conventional methods and techniques, as described above.

Lithography may be performed to form at least one recess 290 within the device 200. As described above, lithography may be performed by known methods. The at least one recess 290 may be, for example, at least one deep trench isolation (DTI) recess 300 that extends through the at least one second oxide layer 270, the at least one silicon layer 260, the at least one first oxide layer 250, and into the substrate 210. The at least one recess 290 may also be, for example, at least one shallow trench isolation (STI) recess 310 that extends through the second oxide layer 270, the silicon layer 260, and the first oxide layer 250. At least one third oxide layer 280 may be deposited over the device 200 filling the at least one recess 290, for example, the at least one DTI recess 300 and the at least one STI recess 310, and forming a layer on the at least second oxide layer 270. After deposition, the oxide layer 280 may be planarized. The planarization may be any conventional method, for example, chemical mechanical planarization (CMP). A silicon nitride (SiN) layer 320 may be deposited over the device 200 and disposed on the oxide layer 280. After the deposition, the SiN layer 320 may be planarized, for example, by CMP.

Figure 13:
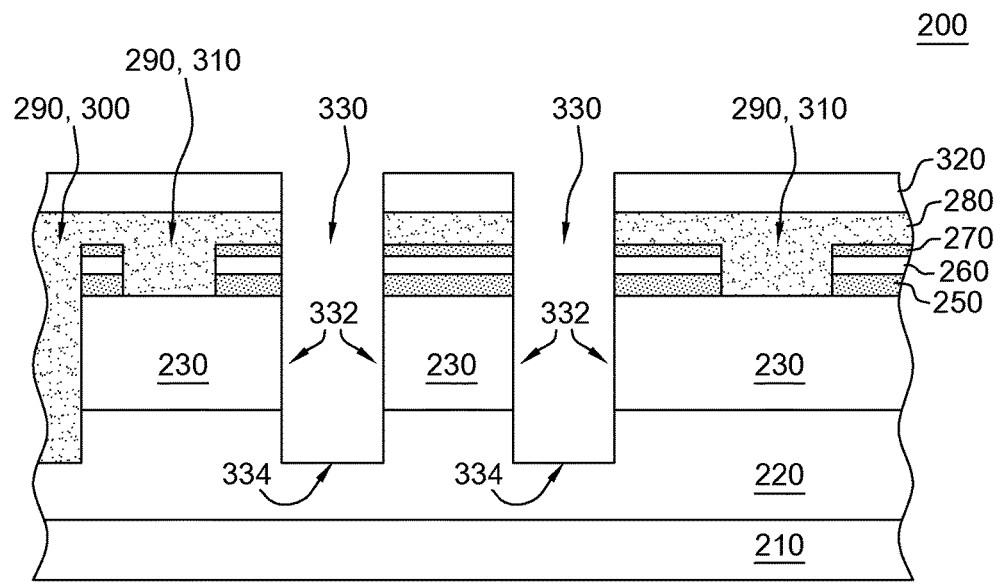
FIG. 13 depicts a cross-sectional elevation view of the structure of FIG. 12 after forming at least one opening in the at least one recess, in accordance with one or more aspects of the present invention.

Lithography may be performed to form at least one opening 330 within the at least one recess 290, as depicted in FIG. 13. For example, at least one opening 330 may be formed within the at least one DTI recess 300. The at least one opening 330 may extend to the top of substrate 210 and through the SiN layer 320, the at least one third oxide layer 280, the at least one second oxide layer 270, the at least one silicon layer 260, the at least one first oxide layer 250, and into the substrate 210. The at least one opening 330 may be formed with sidewalls 332 and a bottom surface 334, and may extend into the substrate 210.

Figure 14:
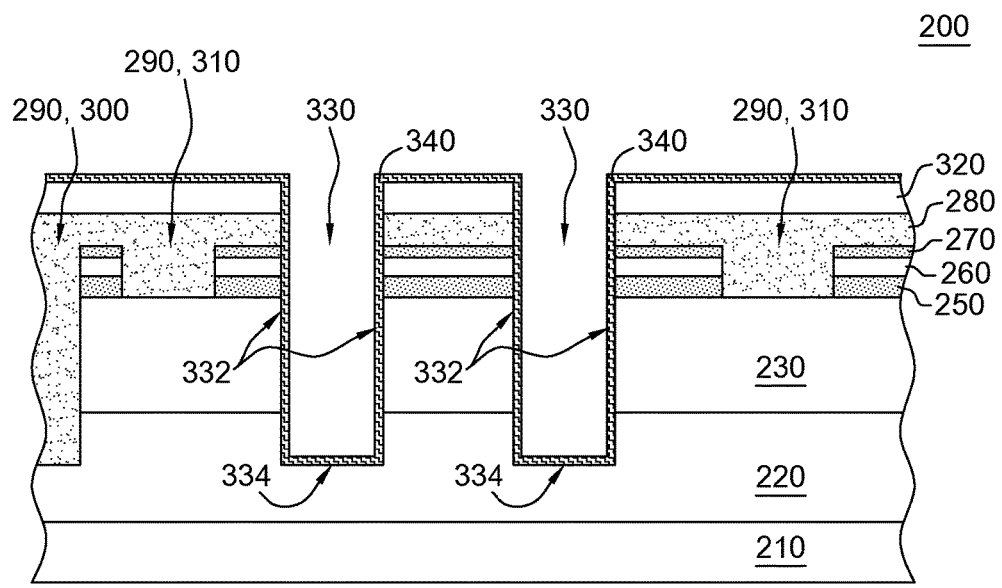
FIG. 14 depicts a cross-sectional elevation view of the structure of FIG. 13 after depositing a high k dielectric layer over the device, in accordance with one or more aspects of the present invention.

As depicted in FIG. 14, a high k dielectric layer 340 may be deposited over the device 200, forming a layer on the SiN layer 320 and on the sidewalls 332 and the bottom surface 334 of the at least one opening 330. The high k dielectric layer 340 may include dielectric material, for instance, hafnium oxide (HfO2), aluminum oxide (Al2O3), hafnium aluminum oxide (HfAlO), nitrogen doped hafnium oxide (HfNO), or any combination of them. The high k dielectric layer 340 may be a thin layer, for instance, of 1 nm to 10 nm in thickness. For example, a high k dielectric layer of 2 nm to 3 nm thickness may be used in the fabrication of a FEOL device.

Figure 15:
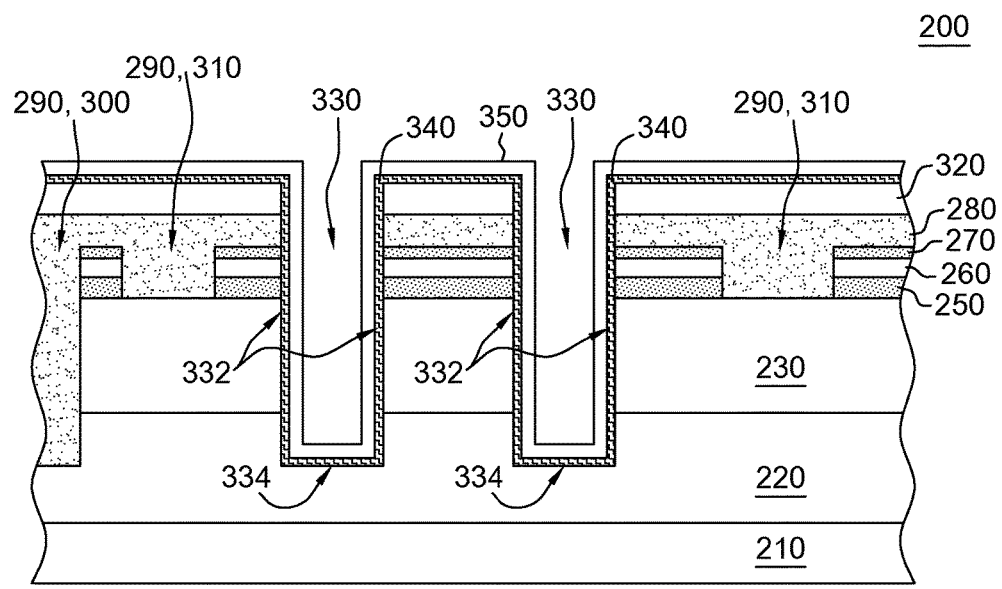
FIG. 15 depicts a cross-sectional elevation view of the structure of FIG. 14 after depositing a work function metal (WFM) layer over the device, in accordance with one or more aspects of the present invention.

As depicted in FIG. 15, a layer of work function material (WFM) 350 may be deposited over the device 200 and may be disposed on the high k dielectric layer 340. The WFM layer 350 may conform to the SiN layer 320 and on the high k dielectric layer 340. The WFM layer may be a thin layer, for instance, of 1 nm to 10 nm in thickness. For example, a WFM layer of 4 nm to 6 nm thickness may be used in the fabrication of a FEOL device. The WFM layer 350 may include, for example, titanium nitride (TiN), titanium carbon aluminum (TiCAl), tantalum nitride (TaN), aluminum (Al), or any combination of them.

Figure 16:
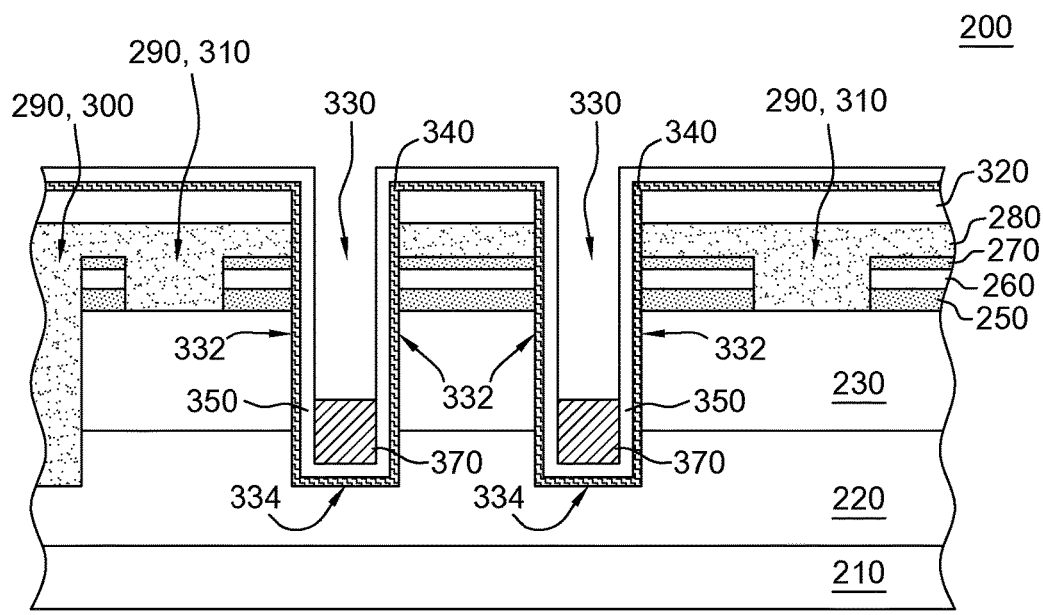
FIG. 16 depicts a cross-sectional elevation view of the structure of FIG. 15 after depositing an organic planarization layer (OPL) to partially fill the at least one recess and covering a portion of the WFM layer, in accordance with one or more aspects of the present invention.

As depicted in FIG. 16, an organic planarization layer (OPL) 370 may be deposited to partially fill the at least one opening 330. For example, the OPL 370 may be deposited to fill the at least one opening 330, such that the top of the OPL 370 is at a level within the p-well region 230 and the bottom portion of the OPL 370 is positioned within the n-well region 220.

Figure 17:
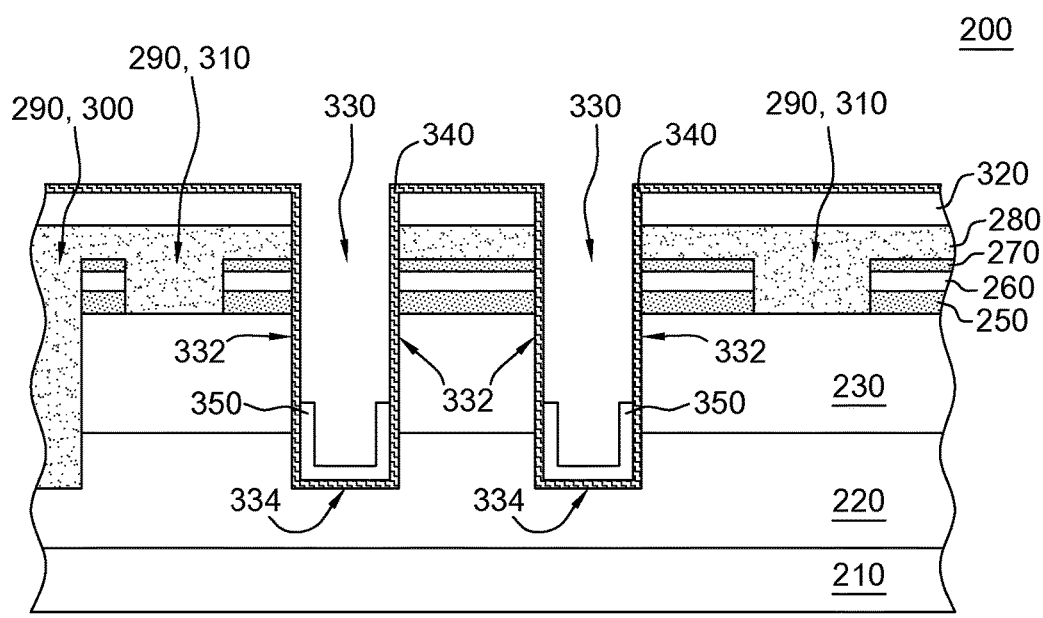
FIG. 17 depicts a cross-sectional elevation view of the structure of FIG. 16 after performing OPL chamfer and etching to remove at least a portion of the WFM layer, in accordance with one or more aspects of the present invention.

As depicted in FIG. 17 and described above, at least a portion of the WFM layer 350 and the OPL 370 may be removed. For instance, the device 200 may be patterned for metal chamfering and metal chamfer may be performed to remove at least a portion of the WFM layer 350, e.g. the portion not covered by the OPL 370 (not shown). Lithography may be performed to pattern and etch to remove the OPL 370 (not shown). A portion of the WFM layer 350 may remain on a portion of the sidewalls 332 and on the bottom surface 334 of the at least one opening 330. The height of the WFM layer 350 remaining on the sidewalls 332 may be, for instance, positioned within the p-well region 230 and the bottom portion of the WFM layer 350 may be within the n-well region 220.

Figure 18:
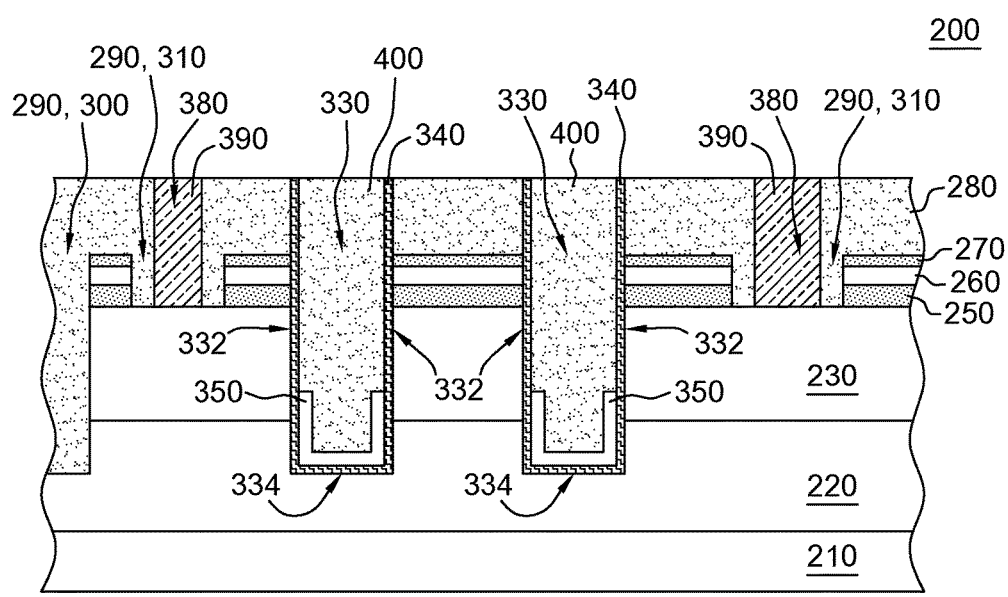
FIG. 18 depicts a cross-sectional elevation view of the structure of FIG. 17 after depositing an oxide layer over the device, filling the at least one opening, and planarizing the device, and also depicts a cross-sectional elevation view of FIG. 19 along the line 18-18, in accordance with one or more aspects of the present invention.

As depicted in FIG. 18, a layer of oxide 400 may be deposited over the device 200 to fill the at least one opening 330 and planarized by, for example, CMP. The CMP may also remove, for example, the SiN layer 320 and portions of the high k dielectric layer 340.

The device 200 may undergo front end of the line (FEOL) processes and back end of the line (BEOL) processes. Lithography may be performed to pattern and etch, for instance, at least one cavity 380 within the at least one opening 330, as depicted in FIG. 18. The at least one cavity 380 may be formed within, for instance, at least one STI recess 310 that is filled with the layer of oxide 400 such that the at least one cavity 380 extends to the top of the substrate 210.

Metallization processes may be performed on the device 200 and as depicted in FIG. 18, the at least one cavity 380 may be filled with metal 390, for example, tungsten (W).

Figure 19:
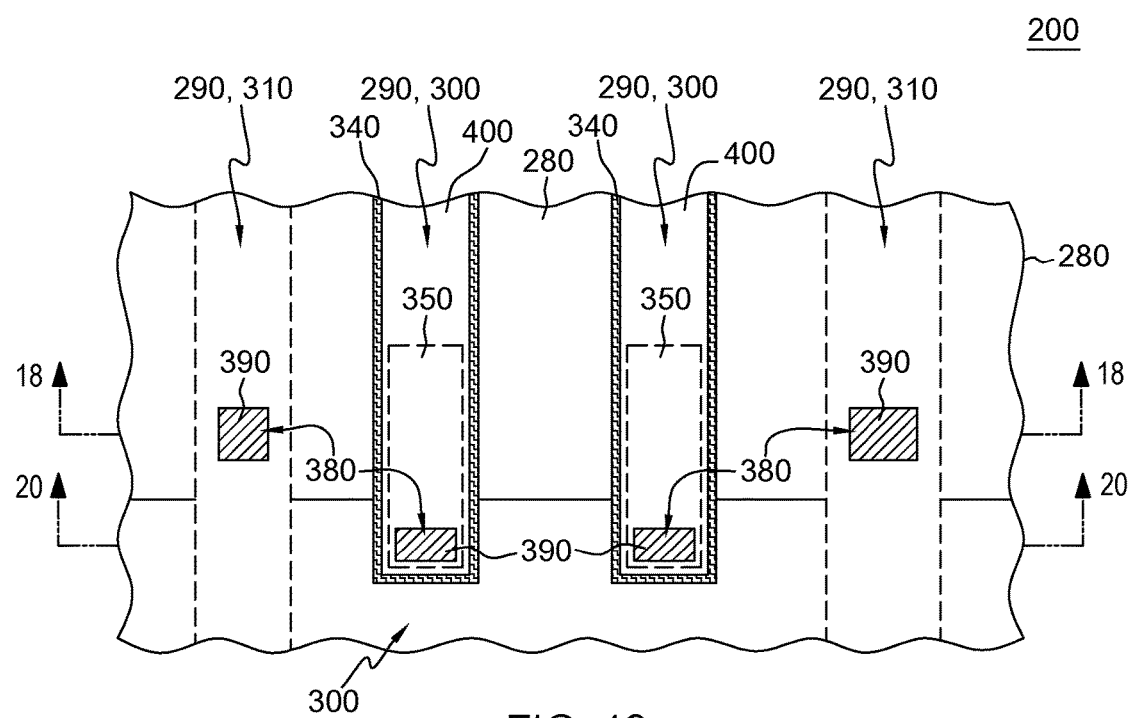
FIG. 19 depicts a top-view of the structure of FIG. 18, in accordance with one or more aspects of the present invention.

As depicted in FIG. 19, a top-view of the device 200, the WFM layer 350 may be disposed on a portion of the length of the high k dielectric layer 340 disposed on the at least one recess 290, for example, at least one DTI recess 300. When viewed from the top, the at least one cavity 380 that is filled with metal 390 may be a geometric shape, for example, a square or a rectangle. The top-view of the at least one cavity 380 filled with metal 390 is not limited to a square or a rectangle shape, and may take a shape of, for example, a circle, an oval, a trapezoid, or any polygon.

Figure 20:
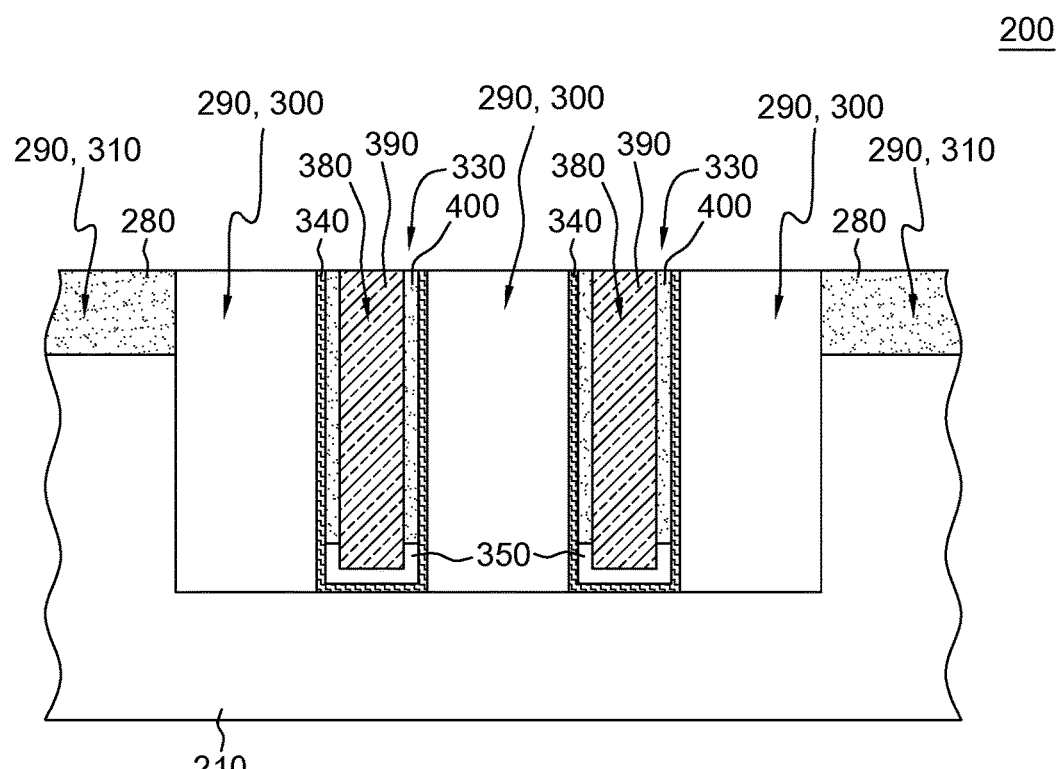
FIG. 20 depicts a cross-sectional elevation view of FIG. 19 along the line 20-20, in accordance with one or more aspects of the present invention.

As also depicted in FIG. 20, the at least one cavity 380 may be formed within, for instance, the at least one DTI recess 310 that has the high k dielectric layer 340 and the WFM layer 350, as described above. The at least one cavity 380 may then be formed to, for example, conform to the bottom portion of the WFM layer 350. Metallization processes may be performed on the device 200 and the at least one cavity 380 may be filled with metal 390, for example, tungsten (W). When filled, the at least one cavity 380 may be a metal pillar.

As described above but not shown, in certain embodiments an intermediate semiconductor device may have been processed through initial device processing steps in accordance with the design of the device being fabricated. For example, as described above, the device 200 may have: at least one first layer of oxide 250 deposited over the device 200 to form a layer on the substrate 210; at least one silicon layer 260 deposited on the at least one first layer of oxide 250; and at least one second layer of oxide 270 deposited on the at least one silicon layer 260. The deposition process may be any conventional methods and techniques, as described above.

Lithography (not shown) may be performed to form at least one first recess (not shown) within the device. As described above, lithography may be performed by known methods. In certain embodiments, the at least one first recess (not shown) may be similar to, for example, at least one deep trench isolation (DTI) recess 300 of FIG. 2 that extends through the at least one second oxide layer 270, the at least one silicon layer 260, the at least one first oxide layer 250, and into the substrate 210. At least one third oxide layer (not shown) may be deposited over the device filling the at least one first recess (not shown) and forming a layer on the at least second oxide layer (not shown). After deposition, the at least one third oxide layer (not shown) may be planarized. The planarization may be any conventional method, for example, chemical mechanical planarization (CMP). A silicon nitride (SiN) layer (not shown) may be deposited over the device and disposed on the at least one third oxide layer (not shown). After the deposition, the SiN layer (not shown) may be planarized, for example, by CMP. At least one second recess (not shown) may be formed, and the at least one second recess may be similar to, for example, the at least one opening 330 within the at least one shallow trench isolation (STI) recess 310 as depicted in FIG. 4, that extends through the SiN layer 320, the at least one third oxide layer 280, the at least one second oxide layer 270, the silicon layer 260, and the at least one first oxide layer 250.

In certain embodiments, the at least one first recess (not shown) may also be at least one shallow trench isolation (STI) recess, similar to the at least one STI recess 310 depicted in FIG. 2 that extends through the at least one second oxide layer 270, the silicon layer 260, and the at least one first oxide layer 250. At least one third oxide layer (not shown) may be deposited over the device filling the at least one first recess, e.g. the at least one STI recess (not shown), and forming a layer on the at least second oxide layer (not shown). At least one third oxide layer (not shown) may be deposited over the device filling the at least one first recess (not shown) and forming a layer on the at least second oxide layer (not shown). After the deposition, the at least one third oxide layer (not shown) may be planarized. The planarization may be any conventional method, for example, chemical mechanical planarization (CMP). A silicon nitride (SiN) layer (not shown) may be deposited over the device and disposed on the at least one third oxide layer (not shown). After the deposition, the SiN layer (not shown) may be planarized, for example, by CMP.

At least one second recess (not shown) may be formed, and the at least one second recess formed may be similar to, for example, the at least one opening 330 within at least one deep trench isolation (DTI) recess 300 as depicted in FIG. 13, that extends through the SiN layer 320, the at least one third oxide layer 280, the at least one second oxide layer 270, the silicon layer 260, and the at least one first oxide layer 250. After forming the at least one second recess (not shown), a high k dielectric layer (not shown), as described above, may be deposited over the device and over the at least one second recess, covering the sidewalls (not shown) and the bottom surface (not shown) of the at least one second recess. For example, the at least one second recess is a DTI recess with a high k dielectric layer may be similar to the at least one DTI recess 330 depicted in FIG. 14.

A WFM layer (not shown), as described above, may be deposited over the device and disposed on the high k dielectric layer (not shown). After the deposition of the WFM layer (not shown), lithography may be performed to pattern and etch to remove at least a portion of the WFM layer (not shown) not covered by, for example, photoresist (not shown). Next, OPL (not shown) may be deposited over the device to partially fill the at least one second recess (not shown) and be disposed on the WFM layer (not shown) that remain after etching. At least a portion of the WFM layer (not shown), e.g. the portion not covered by the OPL, may then be removed, as described above.

An oxide layer (not shown) may then be deposited over the device, filling the at least one second recess (not shown) and planarized, for example, by CMP. The SiN layer (not shown) may be removed during the planarization process. For example, where the at least one second recess is a STI recess, the at least one second recess may be similar to the at least one opening 330 within the at least one STI recess 310 depicted in FIG. 9. As an another example, where the at least one second recess is a DTI recess, the at least one second recess may be similar to the at least one opening 330 within the at least one DTI recess 300 depicted in FIG. 18

Next, as described above, lithography may be performed to pattern and etch at least one cavity (not shown) within the at least one first recess (not shown), for instance, the at least one STI recess (not shown) or the at least one DTI recess (not shown), or within the at least one second recess, for instance, the at least one STI recess (not shown) or the at least one DTI recess (not shown) having the WFM layer disposed on a portion of the sidewalls and the bottom surface.

As described above, metallization processes may be performed on the device (not shown), and the at least one cavity (not shown) may be filled with metal (not shown), for example, tungsten (W).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:
1. An intermediate semiconductor device comprising:
   a wafer comprising
      a silicon substrate,
      at least one first oxide layer disposed on at least a portion of the wafer, at least one silicon layer disposed on the at least one first oxide layer, at least one second oxide layer disposed on the at least one silicon layer, at least one recess in the wafer, at least one third oxide layer disposed on the wafer, wherein the at least one recess in the wafer is filled with the at least one third oxide layer, at least one opening in the at least one recess, the at least one opening having sidewalls and a bottom surface, a high k dielectric layer disposed on the sidewalls and the bottom surface of the at least one opening, a work function material (WFM) layer disposed on at least a portion of the high k dielectric layer, and at least one cavity within the at least one opening, wherein the at least one cavity is filled with metal and the at least one opening is filled with oxide.

2. The device of claim 1, wherein the at least one recess comprises:

at least one deep trench isolation (DTI) recess; and at least one shallow trench isolation (STI) recess.

3. The device of claim 1, wherein the at least one cavity is positioned between sidewalls of the WFM layer.

4. The device of claim 3, wherein the at least one third oxide layer has a width equal to a width of the WFM layer.

5. The device of claim 3, wherein the at least one third oxide layer has a width greater than a width of the WFM layer.

6. The device of claim 1, the device further comprising:

at least one cavity within the at least one opening, wherein the at least one cavity is filled with metal and the at least one opening is filled with oxide.

7. The device of claim 6, wherein the at least one cavity is positioned between sidewalls of a work function material (WFM) layer.

8. The device of claim 7, wherein the at least one third oxide layer has a width equal to a width of the WFM layer.

9. The device of claim 7, wherein the at least one third oxide layer has a width greater than a width of the WFM layer.

10. The device of claim 1, the device further comprising:

a high k dielectric layer disposed on the sidewalls and the bottom surface of the at least one opening;

a work function material (WFM) layer disposed on at least a portion of the high k dielectric layer; and an organic planarization layer (OPL) disposed on the WFM layer and extending between sidewalls of the WFM layer, wherein the OPL fills a portion of the at least one opening.

11. The device of claim 10, wherein the OPL is recessed in the wafer below the first oxide layer.

* * * * *